US009356327B2

(12) United States Patent
Sisk et al.

(10) Patent No.: US 9,356,327 B2
(45) Date of Patent: May 31, 2016

(54) UNITARY ENERGY STORAGE AND SENSING BATTERIES

(71) Applicant: Johnson Controls Technology Company, Holland, MI (US)

(72) Inventors: Brian C. Sisk, Mequon, WI (US); Jason L. Roberts, Cedarburg, WI (US)

(73) Assignee: Johnson Controls Technology Company, Holland, MI (US)

( * ) Notice: Subject to any disclaimer, the term of this patent is extended or adjusted under 35 U.S.C. 154(b) by 249 days.

(21) Appl. No.: 13/719,025

(22) Filed: Dec. 18, 2012

(65) Prior Publication Data

US 2013/0157093 A1  Jun. 20, 2013

Related U.S. Application Data

(60) Provisional application No. 61/577,385, filed on Dec. 19, 2011.

(51) Int. Cl.
| | |
|---|---|
| *H01M 10/48* | (2006.01) |
| *G01R 31/36* | (2006.01) |
| *H01M 10/42* | (2006.01) |
| *H01M 10/633* | (2014.01) |
| *H01M 10/0525* | (2010.01) |

(52) U.S. Cl.
CPC ......... *H01M 10/486* (2013.01); *G01R 31/3606* (2013.01); *G01R 31/3655* (2013.01); *G01R 31/3675* (2013.01); *H01M 10/4257* (2013.01); *H01M 10/0525* (2013.01); *H01M 10/5022* (2013.01); *H01M 10/633* (2015.04); *H01M 2010/4271* (2013.01); *H01M 2010/4278* (2013.01); *Y02E 60/12* (2013.01)

(58) Field of Classification Search
CPC ............... H01M 10/486; H01M 2010/4271; H01M 2010/4278; H01M 10/5022; H01M 10/4257; H01M 10/0525; H01M 10/633; Y02E 60/12; G01R 31/3656; G01R 31/3655; G01R 31/3675; G01R 31/3606
USPC ..................... 429/7, 61, 62, 90, 91
See application file for complete search history.

(56) References Cited

U.S. PATENT DOCUMENTS

| | | | |
|---|---|---|---|
| 3,373,060 A | 3/1968 | Gray | |
| 5,747,189 A * | 5/1998 | Perkins | 429/91 |
| 2005/0162172 A1* | 7/2005 | Bertness | 324/426 |
| 2007/0054156 A1 | 3/2007 | Froeschl et al. | |
| 2008/0238372 A1* | 10/2008 | Cintra et al. | 320/137 |
| 2010/0052615 A1* | 3/2010 | Loncarevic | 320/118 |

FOREIGN PATENT DOCUMENTS

| | | |
|---|---|---|
| CN | 102232255 | 11/2011 |
| EP | 2437339 | 4/2012 |
| JP | 10055825 | 2/1998 |

OTHER PUBLICATIONS

CN 201280070402.8 First Office Action mailed Jan. 25, 2016.

* cited by examiner

*Primary Examiner* — Jonathan Jelsma
*Assistant Examiner* — Omar Kekia
(74) *Attorney, Agent, or Firm* — Fletcher Yoder, P.C.

(57) ABSTRACT

A battery apparatus having an electrochemical cell that includes an electrically insulating hollow mandrel, a pair of active materials wound on the mandrel, and a sensing unit located within the mandrel and coupled to the pair of active materials through a pair of contacts. The active materials are connected and separated by an electrolyte. The sensing unit is configured to monitor conditions of the cell and to generate a signal indicative of a sensed condition for communication to a battery management unit.

18 Claims, 8 Drawing Sheets

UNITARY ENERGY STORAGE AND SENSING BATTERIES

CROSS-REFERENCE TO RELATED APPLICATIONS

The present application claims priority under 35 U.S.C. §119(e) to U.S. Provisional Patent Application Ser. No. 61/577,385, filed Dec. 19, 2011, which is incorporated herein by reference in its entirety.

BACKGROUND

Unless otherwise indicated herein, the materials described in this section are not prior art to the claims in this application and are not admitted to be prior art by inclusion in this section.

Figure 1:
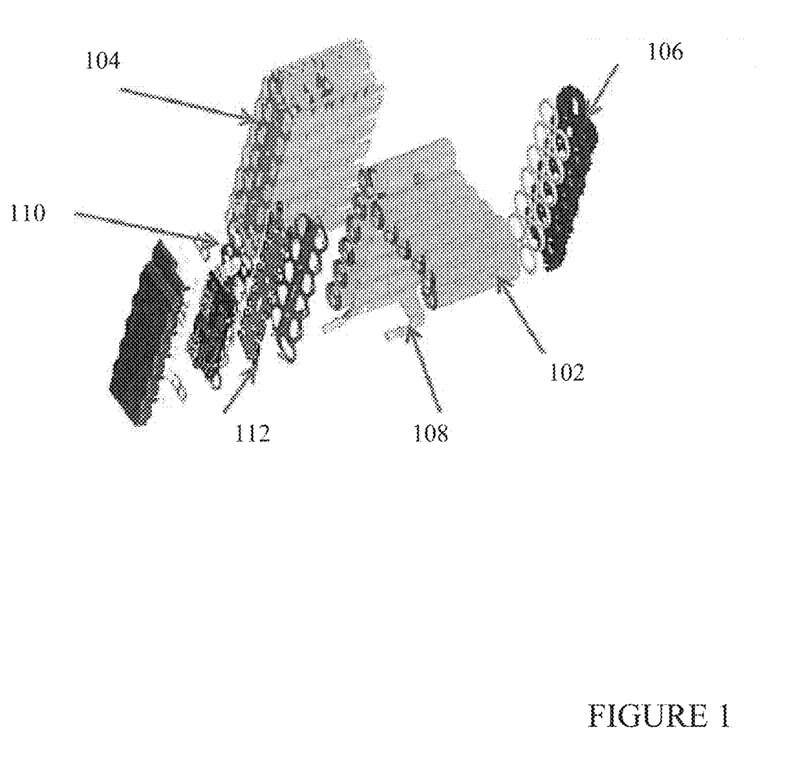
FIG. 1 illustrates an embodiment of a conventional battery pack.

Various configurations of battery packs are known for housing a plurality of energy-storing cells. Typically, the cells are fitted internally into containers, such as the cell canisters 102 of FIG. 1. In addition to cell canisters 102, typical battery packs include a module container 104, a module assembly 106, cooling channels 108, a cell supervisory controller (CSC) 110, and a traceboard 112. Thus, conventional battery packs contain a large amount of materials that do not contribute to energy capacity.

Some multicell sealed rechargeable batteries include an open mouth container and a closure member attached to the container at its mouth. In addition to the mouth, the materials used to form the container typically allow external moisture to penetrate the container. This penetration of external moisture may compromise a performance of the cells.

Therefore, there exists a need for a battery apparatus that minimizes the amount of inactive components, and can monitor and communicate conditions of individual cells.

SUMMARY

Disclosed herein are improved energy storage and sensing batteries.

In one aspect, an embodiment of a battery apparatus having an electrochemical cell that includes an electrically insulating hollow mandrel, a pair of active materials wound on the mandrel, and a sensing unit located within the mandrel and coupled to the pair of active materials through a pair of contacts. The active materials are connected and separated by an electrolyte. The sensing unit is configured to monitor conditions of the cell and to generate a signal indicative of a sensed condition for communication to a battery management unit.

In another aspect, a battery apparatus includes an electrochemical cell, which includes an electrically insulating hollow mandrel, a pair of active materials wound on the mandrel, and a communications unit configured to transmit wirelessly signals indicative of conditions of the cell to a battery management unit. The pair of active materials are connected and separated by an electrolyte.

In another aspect, a battery apparatus includes an electrochemical cell, which includes an electrically insulating hollow mandrel, a pair of active materials wound on the mandrel and are connected and separated by an electrolyte, a sensing unit located within the mandrel and coupled to the pair of active materials through a pair of contacts. The sensing unit is configured to monitor conditions of the cell and to generate a signal indicative of a sensed condition for communication to a battery management unit. The battery apparatus further includes a communications unit located within the battery apparatus and coupled to the sensing unit. The communications unit is configured to transmit wirelessly the indicative signal to the battery management unit.

In yet another aspect, a battery apparatus includes a housing configured to house a plurality of energy-storing electrochemical cells, each of the plurality of cells comprising an electrically insulating hollow mandrel, and a cover for sealing the housing and achieving hermeticity of the battery apparatus. The battery apparatus further includes a sensing unit located within each of the mandrels. The sensing unit is configured to monitor conditions occurring within a corresponding cell and to generate a signal indicative of a sensed condition of the corresponding cell for communication to a battery management unit. The battery apparatus further includes a communications unit located within the sealed battery apparatus and coupled to the sensing unit. The communications unit is configured to transmit wirelessly the indicative signal to a battery management unit.

These as well as other aspects, advantages, and alternatives will become apparent to those of ordinary skill in the art by reading the following detailed description, with reference where appropriate to the accompanying drawings. Further, it should be understood that the disclosure provided in this summary section and elsewhere in this document is intended to discuss the embodiments by way of example only and not by way of limitation.

DETAILED DESCRIPTION

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Overview

As stated above, conventional multicell energy storage systems, e.g., battery packs, include inactive components such as cell terminals and casings at the cell level, and bus connections and tray assemblies at a module level. In addition, the manufacturing of these multicell batteries typically involves energy intensive processes, such as the manufacturing process of deep drawn aluminum canisters, and multiple printed circuit boards.

Accordingly, an exemplary embodiment of a novel electrochemical cell includes an electrically insulating hollow mandrel, a pair of active materials wound on the mandrel, a sensing unit located within the mandrel and configured to monitor conditions of the cell, in order to generate a signal indicative of a sensed condition for communication to a battery management unit.

In another exemplary embodiment, a novel Unitary Energy Storage and Sensing (UESS) battery pack is provided. This UESS battery pack includes sensing units and a communications unit that communicates sensed conditions to a battery management system. The sensed conditions may be thermal levels, voltage levels, or any other condition that should be monitored to maintain a desirable operating status of the UESS battery pack. In one embodiment, the UESS battery pack includes a housing or container that is formed of a single polymer monobloc container, and has a configuration that leads to a reduction of non-active material and component count. The UESS battery pack includes rechargeable electrochemical cells, which can have substantially the same capacity and are connected in series. When housed in the single monobloc container, the electrochemical cells are easier to handle, can be produced at a lower cost, and have a higher weight-related and volume-related energy density, due to the saving of material and due to the reduction in the count of individual parts.

Figure 2:
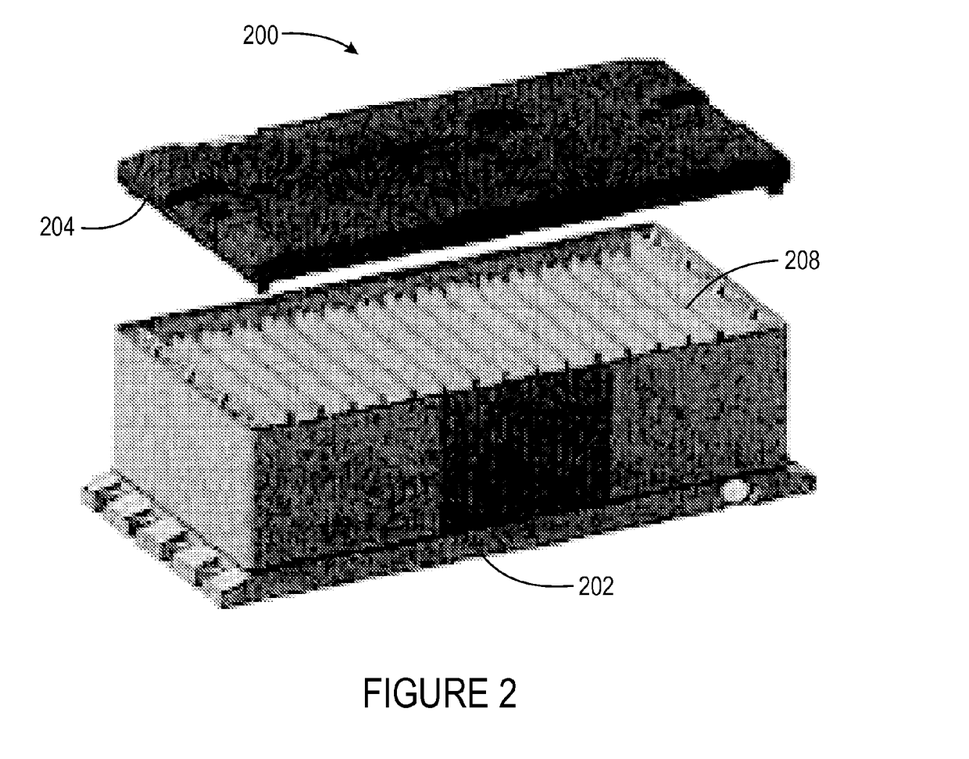
FIG. 2 illustrates an exemplary embodiment of a unitary energy storage.

Now referring to FIG. 2, an exemplary embodiment of a UESS battery pack or apparatus 200 is shown. UESS battery 200 includes a polymer case or housing 202 and a cover 204. Housing 202 is configured to contain a plurality of electrochemical cells 208 with no other physical barrier between them. Cover 204 may be formed of the same polymer material as that of housing 202 or any other suitable material. The desirable properties of UESS materials include withstanding organic solvents in cells, maintaining desirable mechanical properties over a wide range of operating temperatures, and preventing moisture penetration, i.e., maintaining hermeticity.

As known to one of ordinary skill in the art, a working unit in a battery is the electrochemical cell, which consists of a cathode and an anode separated and connected by an electrolyte. The electrolyte conducts ions but is an insulator to electrons. During a discharge state, an ion leaves the anode and migrates through the electrolyte to the cathode while its associated electron is collected by a current collector to be used to power a coupled electric device. Further, it is known that electrolytes are highly susceptible to moisture absorption, resulting in significant reduced performance. As such, to preserve battery chemistry UESS battery 200 is configured to maintain hermeticity, which can be accomplished by properly sealing housing 202 with cover 204 and by selecting materials for both housing 202 and cover 204 that are moisture resistant.

Regarding the proper sealing of UESS battery 200, select polymer joining techniques are used. These sealing techniques may include laser welding, heat plate welding, vibration welding, and ultrasonic welding, which are known to be energy efficient and have high throughput. Alternatively, any other suitable sealing techniques may be used to properly seal UESS battery 200. Regarding moisture resistance, select materials may include polypropylene (PP) composites and polytrafluroethylene (PTFE). Alternatively, any other suitable materials may be used to secure and maintain hermeticity. As such, the joining of cover 204 to housing 202 is configured to achieve battery hermeticity and desirable mechanical strength. To further secure hermeticity, terminals (not shown) of UESS battery 200 may be heat staked to cover 204.

Figure 3:
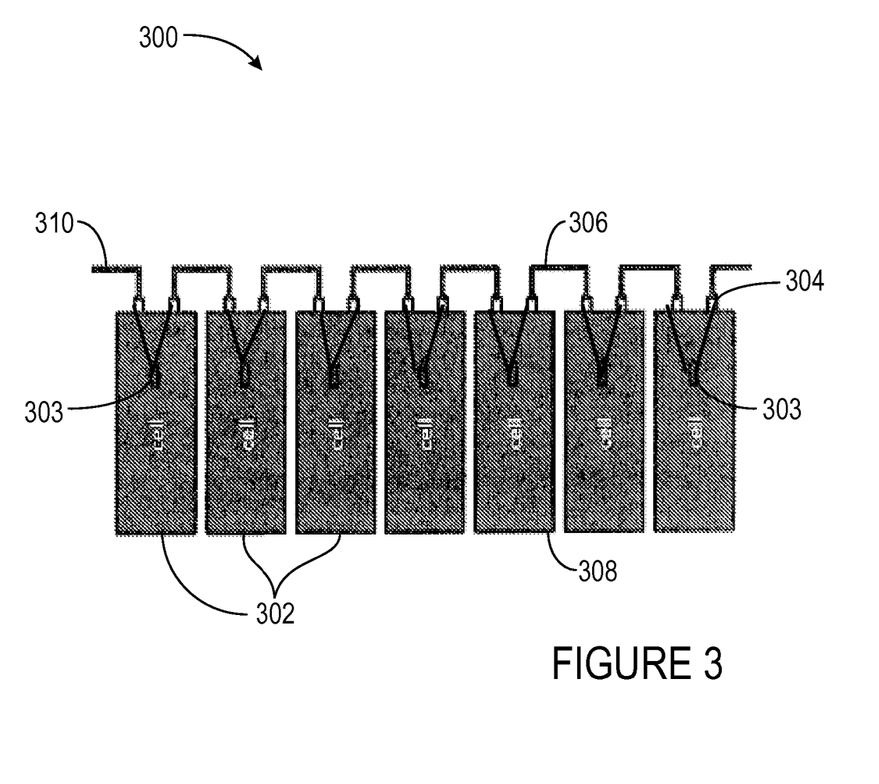
FIG. 3 is a schematic diagram illustrating an exemplary arrangement of a plurality of cells within the unitary energy storage of FIG. 1.

Now referring to FIG. 3, an exemplary arrangement 300 of a plurality of cells 302 within UESS battery 200 is shown. Cells 302 are aligned in series and cell terminals 304 of adjacent cells 302 are connected by inter-cell connectors 306, which are shown to bridge over housing cell separators 308, which can be part of a monobloc container. As shown, each of cells 302 include an in situ sensor 303 that is coupled the cell terminals 304. In one embodiment, as individual cells 302 need to be electrically connected, inter-cell terminals can be insert-molded into housing 202 and cover 204 for connection to cells 302. After sealing housing 202, inter-cell electrical connections 304 can be accomplished via resistance welding or via any other suitable connectivity technique. Further, in one embodiment, after sealing housing 202 using cover 204, inter-cell connectors 306 and cell terminals 304 can form a DC power bus or power line 310. Alternatively, power line 310 can be affixed to cover 204 and is configured to couple to the terminals of cells 302 when cover 204 seals housing 202.

Figure 4A:
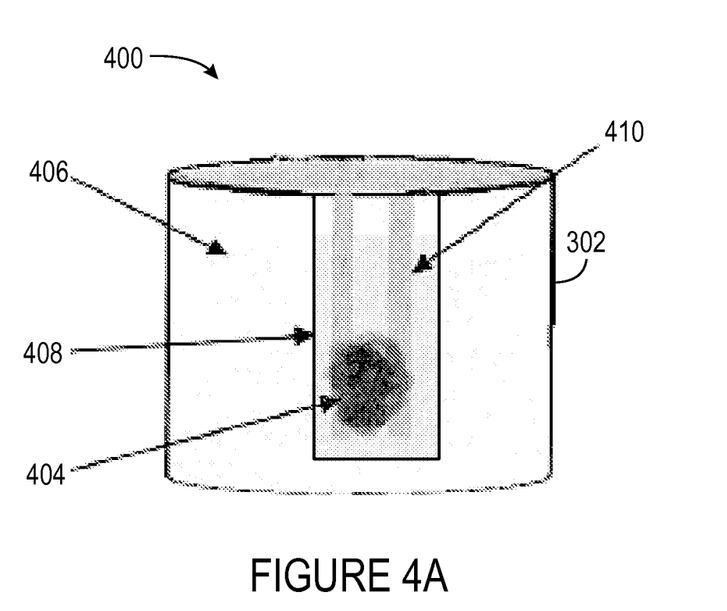
FIG. 4A is an elevated side view of an exemplary embodiment of an in-situ temperature sensor arrangement in an electrochemical cell.

Now referring to FIG. 4A, an exemplary embodiment 400 of an in-situ sensor arrangement within a cell 302 is illustrated. The in-situ sensor can be a temperature sensor, a voltage sensor, a pressure sensor, or any other sensor configured to sense a cell condition that should be monitored. As shown in FIG. 4A, a temperature sensor 404 is included in situ in cell 302, i.e., integrated inside an electrically insulating mandrel 406, to monitor conditions occurring deep within cell 302. In one embodiment, each cell 302 of UESS battery 200 includes one sensor 404.

Figure 4B:
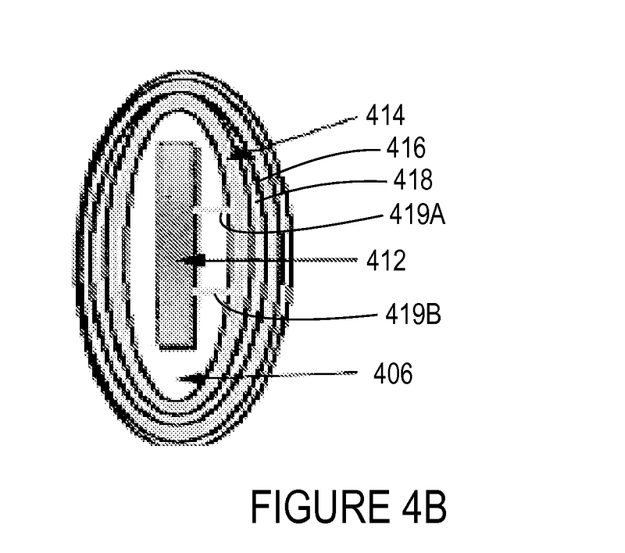
FIG. 4B is a top view of the exemplary embodiment of an in-situ temperature sensor arrangement of FIG. 4A.

Now referring to FIGS. 4A-B, a microsensor integrated circuit (IC) chip may be used as a sensor, and includes supporting electronic functions. In one embodiment, in case of a temperature sensor, the IC chip includes a temperature sensor head. For this temperature embodiment, a conductive coating is applied to mandrel 406 to form the electrode leads and connect temperature sensor 404 to these leads prior to the winding process. Further, a protective coating 408 is applied and contacts 410 originating from temperature sensor 404 are welded to a Power Line Communications (PLC) chip 412. Moreover, each cell 302 is wound with a pair of active materials to form electrodes 414 and 416 that are separated and connected by an electrolyte 418. As shown in FIG. 4B, in one embodiment, electrodes 414 and 416 are wound externally around mandrel 406 in a substantially flat arrangement, and each electrode 414 and 416 is connected to one of leads 419$a$ and 419$b$ of PLC chip 412. As stated above, the microsensor IC chip may also be used as a voltage sensor, a pressure sensor, or any other desirable sensor that monitors select conditions of cells 302.

In one exemplary embodiment, cell 302 can further includes a combination of an anode, a cathode and a polymer electrolyte, all wound around mandrel 406. Their wounding arrangement of these three components can be in a form of a jelly roll, or of a vertical stacking of the wound anode, electrolyte, and cathode around mandrel 406. Alternatively, the anode, the electrolyte and the cathode can be arranged as vertical bands aligned circumferentially around mandrel 406. Thus, mandrel 406 is provided as a hollow plastic tube to provide shape to cell 302 at the beginning of the component arrangement process.

In another embodiment, the anode, the cathode, and the polymer electrolyte may be all arranged internally within mandrel 406. Their internal arrangement can be in a form of a jelly roll, or of a vertical stacking of anode, electrolyte, and cathode, all lining an inside surface of mandrel 406. Alternatively, the anode, electrolyte, and cathode can be arranged as vertical bands aligned circumferentially on the inside surface of mandrel 406.

Figure 5A:
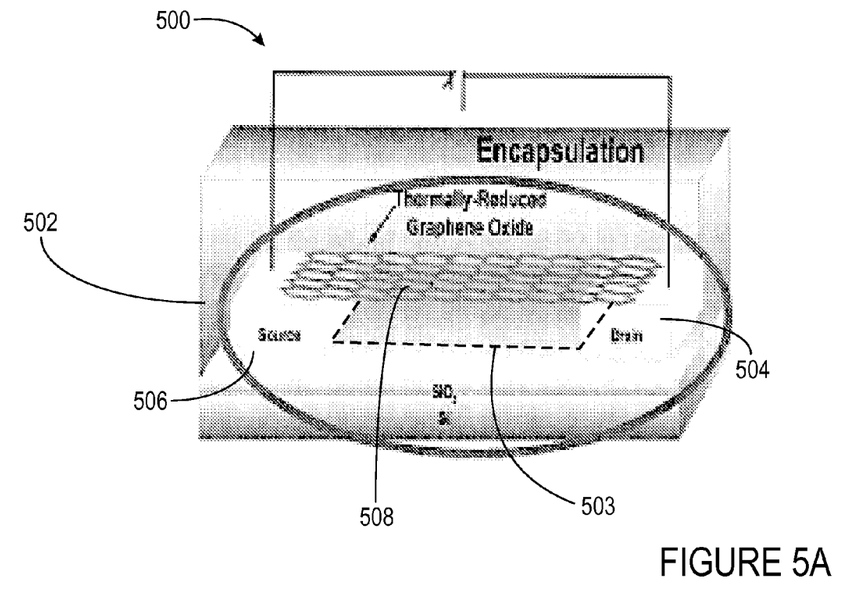
FIG. 5A is a schematic diagram of an exemplary embodiment of an in situ temperature sensor.
Figure 5B:
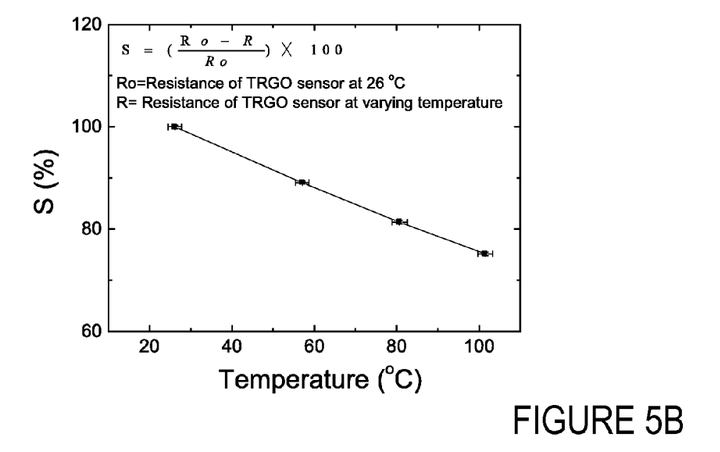
FIG. 5B is a graph illustrating a linear response of a temperature sensing material to temperature changes.

A temperature sensor may be formed of any temperature sensitive material that offers a desirable quick response to temperature changes, and a robust, linear electronic signal response in the temperature range that is expected within cells 302 of UESS battery 200, as shown in FIG. 5B. This temperature sensitive material enables the temperature sensor to produce a repeatable response that is desirably linear with the temperature. Further, the temperature sensitive material may be sprayed or drop-cast directly to the sensor electrodes. One such material is Graphene, which is known to react very fast to temperature changes, thereby providing more reaction time for abuse tolerance and ensuring the best battery performance.

As shown in FIG. 5A, which illustrates an exemplary embodiment 500 of a temperature sensor head 502 within temperature sensor 404, one working principle of temperature sensor 404 is based on a channel 503, formed between a drain component 504 and a source component 506, becoming open after a temperature material slice 508 is partially reduced by thermal treatment, which results in the resistance of temperature sensor 404 changing with varying temperatures. This material for temperature sensor 404 may be selected to have the following advantageous characteristics:

- Size—The thickness of the sensor is desirably small for easy encapsulation, for example of the order of a few nanometers.
- Response Time—The sensor desirably provides a sensor response of less than 1 microsecond. In practice, response time is limited by thermal mass of the sensor body and the timescale of thermal change in the environment. Real-time temperature response is thus ensured.
- Connectivity—The sensor can be directly applied to an integrated electrode by spraying or dip-coating, eliminating the need for bulky or fragile connections, such as wire-bonds The ability to directly apply sensor material to the electronics is a key differentiator for this graphene application.
- Integration—The sensor can be more easily integrated in challenging applications, including limited space and chemically caustic environments.

Figure 6:
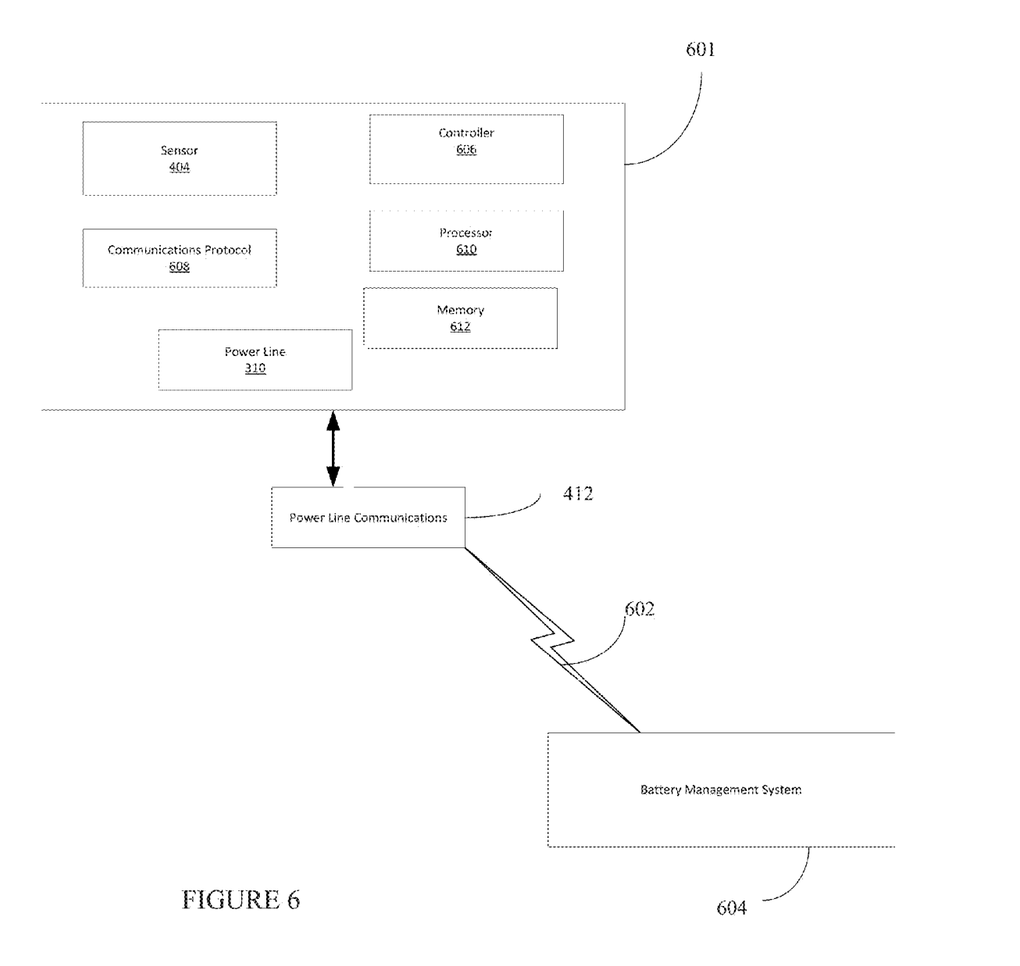
FIG. 6 is a block diagram illustrating components of a in situ sensor and its communications link to a battery management system.

As discussed above, temperature sensor 404 is coupled to a PLC chip 412. As shown in FIG. 6, a data communications link 602 can be established between PLC chip 412 and a battery management device or system 604. Communications link 602, which includes power line 310, can include a wired connection or a wireless communication between UESS battery pack 200 and system 604. As discussed above, the IC chip that is embedded in mandrel 406 is connected to the positive and negative terminals of cell 302. The cell terminals are also connected to power line 310, which provides both power to sensor 404 and enables communication to system 604. As shown in FIG. 6, an IC chip 601 includes a controller 606 that is coupled to sensor 404 and power line 310, and is configured to digitize a sensor signal and to communicate it to system 604 via a PLC Chip 412. IC chip 601 further includes a micro-processing unit 610 and a memory unit 612 for performing and storing monitoring and controlling instructions. Thus, in one embodiment, IC chip 601 is configured to integrate sensor404, monitor and controller 606 and communication protocols 608. As such, PLC chip 412 is employed to convey the digitized sensor signal from the IC chip 601 to system 604.

PLC chip 412 is configured to provide the cell measurement data via power line 310 through a modulated digital signal. Moreover, an advanced error mitigation algorithm can be employed with up to 6 levels of error correction and protection, thereby minimizing any risk of sending incorrect data. System 604 is configured to decode the modulated signal into the raw data and process it accordingly. This fault-tolerant approach can correct a wide variety of impediments to PLC chip 412 including impulsive noise, continuous tone noise, phase distortion, and multiple transceivers on power line 310. PLC chip 412 is configured to provide a robust and reliable operation for this proposed in-situ configuration, including a concurrent use of up to 200 cells 302 wired in series.

As stated above, communications link 602 can include a wireless communication between UESS battery pack 200 and system 604. This wireless communication can be accomplished by coupling a wireless communication unit (not shown) to PLC chip 412 to transmit wirelessly the modulated digital signal to system 604. The wireless communication unit can be a Bluetooth communication unit or any other suitable digital communication unit. In one embodiment, the wireless communication unit is internal to a hermetically and permanently sealed UESS battery pack 200.

In this case, UESS battery pack 200 includes Li-ion cells and, as known to one of ordinary skill in the art, operations of Li-ion batteries require a robust thermal management strategy. Initial experimental results suggest the use of thermally conductive materials integrated into UESS battery 200 to increase thermal conductivity. Three materials with high thermal conductivity, boron nitride (BN), graphite plates, and copper, have been considered as shown in Table 1 appended below. BN material was found to be preferable due to its combination of high thermal conductivity, low density, and ease of processing, and since it can be easily incorporated as filler in the polymer matrix of UESS battery 202. As shown in Table 1, regarding thermal conductivity properties, BN was found to be substantially comparable to copper but lighter, and graphite is more conductive in the plane of the graphite sheets, but overall conductivity is limited by thermal transfer between sheets.

TABLE 1

| Conductivity Comparison | Thermal conductivity (W/mK) | Density (g/cc) |
| --- | --- | --- |
| Cu | 380 | 8.9 |
| BN | 300+ | 2.3 |
| Graphite | >1500 (in-plane), 10 (out plane) | 2.3 |

As mentioned above, thermal management is critical for the success of a Li-Ion UESS battery. As known to one of ordinary skill in the art, Li-ion battery chemistry is very sensitive to temperature. In fact, a consistent 10-15° C. temperature increase can reduce battery life by half. Further, uneven temperature distribution and localized hot spots that can occur in a Li-ion battery pose a technical challenge that may require innovation in the UESS battery concept. As configured, UESS battery 200 has a reduced heat dissipation area compared to modules assembled from free standing cells, making thermal management of Li-ion UESS batteries another significant challenge. Solving these challenges requires an innovative thermal management strategy.

To develop an efficient thermal management solution for the UESS batteries, thermal conductivity is increased, thermal events are recognized, and heat generation is reduced. The UESS battery technology provides a competitive advantage in terms of energy, cost, and part count over currently used technologies by eliminating or combining parts. Current Li-ion manufacturing processes, which are based on many small parts and complicated assembly, cannot scale to the volumes. The UESS battery technology replaces the cell supervisory controllers and traceboards with a single controller that monitors the temperature of every cell, and replaces the multiple layers of containers with a single module-level monobloc container. The simplified design can also have other benefits for manufacturing processes. Because of the simplicity and modular nature of the UESS design, it can be used as the basis for multiple customized battery pack designs. This can help to streamline the manufacturing process by consolidating multiple production lines at the module level. Importantly, this single manufacturing process can support near-term vehicle technologies, such as Start-Stop and micro-hybrid, as well as technology that will not be realized for multiple vehicle generations, such as advanced electric vehicles. The UESS battery technology is fully compatible with future battery chemistries as well as the existing manufacturing technologies. The technologies for the UESS batteries are highly compatible with the manufacturing infrastructure already in place in the automotive industry.

As mentioned above, IC chip 601 includes a micro-processing unit 610 and a memory unit 612. Moreover, PLC chip 412 also includes a processing unit (not shown) and a memory unit (not shown). Each of the processing units can be implemented on a single-chip. For example, various architectures can be used including dedicated or embedded microprocessor ($\mu P$), a microcontroller ($\mu C$), or any combination thereof. Each of the memory units may be of any type of memory now known or later developed including but not limited to volatile memory (such as RAM), non-volatile memory (such as ROM, flash memory, etc.) or any combination thereof, which may store software that can be accessed and executed by the processing units, for example.

Figure 7:
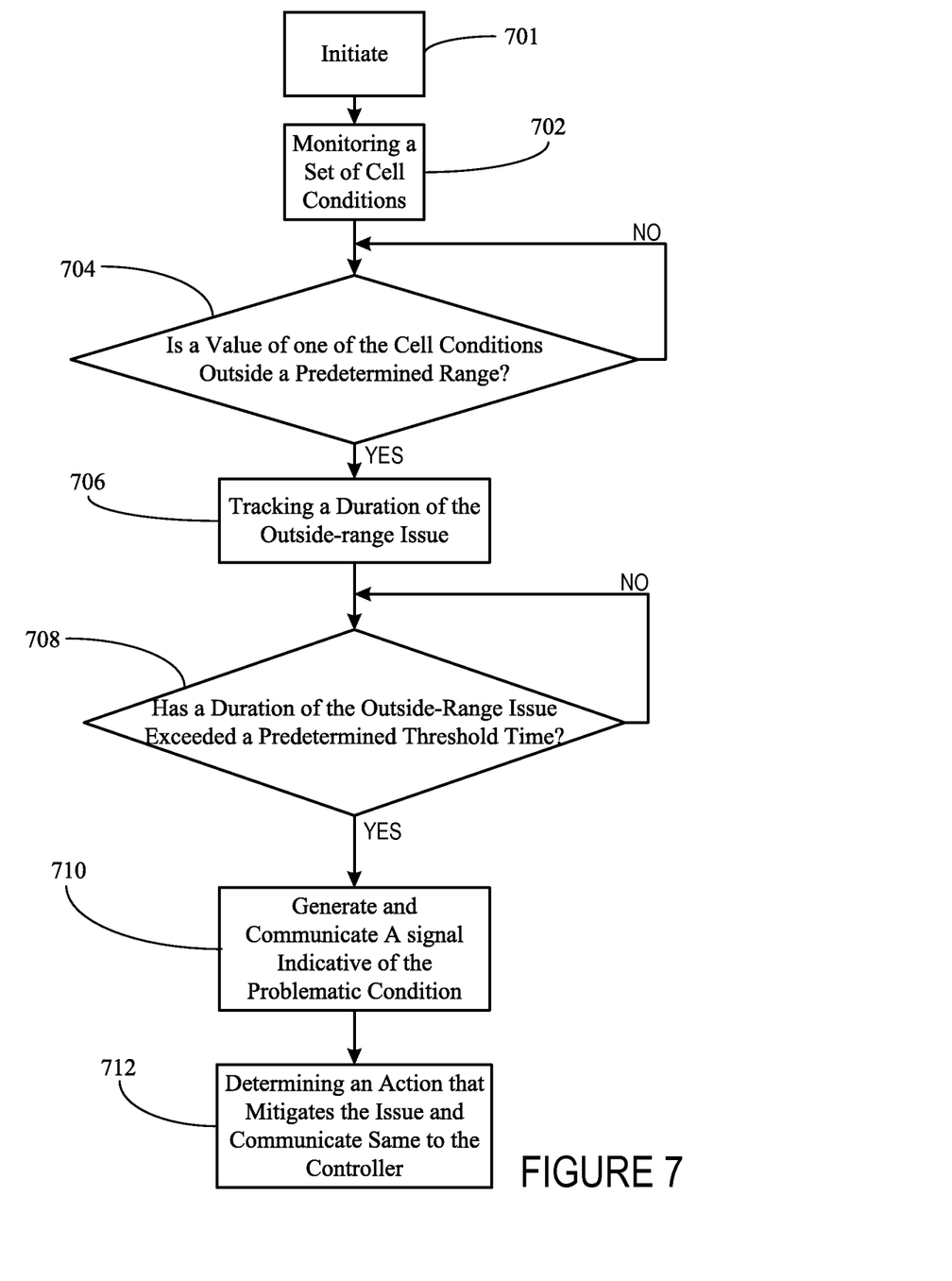
FIG. 7 is a flow chart illustrating a method for monitoring one or more conditions of electrochemical cells housed in the unitary energy storage of FIG. 1.

Now referring next to FIG. 7, a flow diagram shows an exemplary method 700, initiated at step 701, for monitoring and controlling conditions of an electrochemical cell having an in situ microsensor and housed in a monobloc battery. At step 702, controller 606 is configured to monitor a predetermined set of conditions. At step 704, controller 606 determines whether a value of one of the monitored conditions is outside a corresponding predetermined range. If not, then controller 606 continues to determine whether a value of one of the monitored conditions is outside the corresponding predetermined range at step 704. In the affirmative, controller 606 is configured to track a time duration during which values of the identified condition remain outside of the corresponding predetermined range, at step 706. Subsequently, controller 606 determines whether the tracked time duration has exceeded a predetermined duration threshold, at step 708. If not, then controller 606 continues to determine whether the tracked time duration has exceeded the predetermined duration threshold at step 708. In the affirmative, controller 606 triggers a generation of a signal indicative of the issue with the identified condition, and a communication of the indicative signal to battery management system 604, at step 710. Upon receipt of the generated signal, system 604 determines an appropriate action to mitigate the issue of the identified condition, and communicates the determined action to controller 606, at step 712. In one embodiment, system 604 may be configured to generate and send a message to a user that may need to be informed of the status or condition of the monobloc battery.

Figure 8:
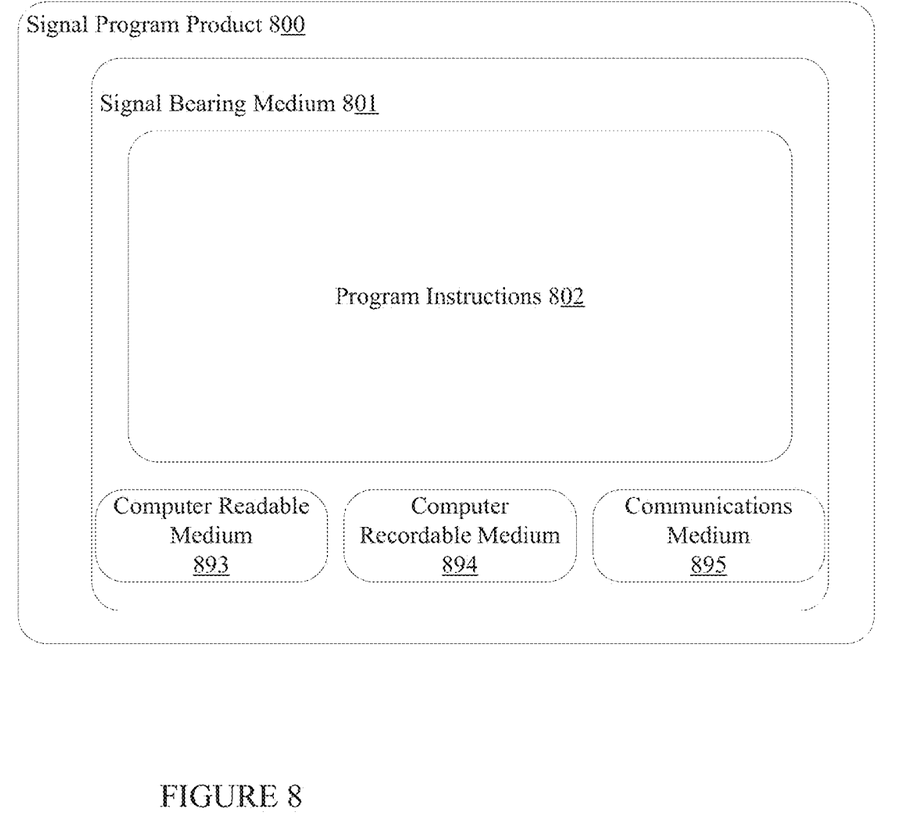
FIG. 8 is a schematic diagram illustrating a conceptual partial view of an example computer program product.

In some embodiments, the disclosed method may be implemented as computer program instructions encoded on a computer-readable storage media in a machine-readable format. FIG. 8 is a schematic illustrating a conceptual partial view of an example computer program product 800 that includes a computer program for executing a computer process on a computing device, arranged according to at least some embodiments presented herein. In one embodiment, the example computer program product 800 is provided using a signal bearing medium 801. The signal bearing medium 801 may include one or more programming instructions 802 that, when executed by a processing unit may provide functionality or portions of the functionality described above with respect to FIG. 7. Thus, for example, referring to the embodiment shown in FIG. 8, one or more features of blocks 702-712, may be undertaken by one or more instructions associated with the signal bearing medium 801.

In some examples, signal bearing medium 801 may encompass a non-transitory computer-readable medium 803, such as, but not limited to, a hard disk drive, memory, etc. In some implementations, signal bearing medium 801 may encompass a computer recordable medium 804, such as, but not limited to, memory, read/write (R/W) CDs, R/W DVDs, etc. In some implementations, signal bearing medium 901 may encompass a communications medium 805, such as, but not limited to, a digital and/or an analog communication medium (e.g., a fiber optic cable, a waveguide, a wired communications link, etc.).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

What is claimed is:

1. An electrochemical battery cell, comprising:
an electrically insulating hollow mandrel;
a pair of active materials wound on the mandrel, wherein the pair of active materials comprises an anode and a cathode; and
an integrated circuit located within the mandrel and directly coupled to the pair of active materials, wherein the integrated circuit comprises a processor, a memory, and a sensor having a graphene-based temperature sensor head, wherein the processor of the integrated circuit is configured to:
receive a measurement of the temperature of the pair of active materials from the sensor;
determine an internal condition of the electrochemical battery cell from the measured temperature; and
generate a signal indicative of the internal condition for communication to a battery management unit external to the electrochemical battery cell.

2. The electrochemical battery cell of claim 1, wherein the pair of active materials are wound around the mandrel in a jelly roll arrangement.

3. The electrochemical battery cell of claim 1, wherein the electrochemical battery cell is configured to be electrically coupled to at least one other electrochemical battery cell by a power line.

4. The electrochemical battery cell of claim 3, wherein the power line is configured to communicatively couple the integrated circuit to the battery management unit.

5. The electrochemical battery cell of claim 1, comprising a power line communications (PLC) chip located within the mandrel and coupled to the integrated circuit, wherein the PLC chip is configured to receive the indicative signal from the integrated circuit and to transmit the indicative signal to the battery management unit.

6. The electrochemical battery cell of claim 1, wherein the processor is configured to:
    receive the measurement of the temperature of the pair of active materials from the sensor;
    determine a value of the internal condition of the electrochemical battery cell based on the received temperature measurement;
    determine whether the value of the internal condition is outside of a predetermined range;
    determine an amount of time that the value of the internal condition is outside of the predetermined range;
    determine whether the amount of time exceeds a predetermined threshold; and
    generate the indicative signal when the amount of time exceeds the predetermined threshold.

7. A battery module comprising:
    a battery management unit; and
    a plurality of electrochemical battery cells, wherein each electrochemical battery cell of the plurality of electrochemical battery cells comprises:
    an electrically insulating hollow mandrel;
    a pair of active materials wound on the mandrel, wherein the pair of active materials comprises an anode and a cathode;
    an integrated circuit located within the mandrel and directly coupled to the pair of active materials, wherein the integrated circuit comprises a processor, a memory, and a sensor having a graphene-based temperature sensor head, wherein the processor of the integrated circuit is configured to receive a measurement of the temperature of the pair of active materials from the sensor and to determine an internal condition of the electrochemical battery cell from the measured temperature; and
    a power line communications (PLC) chip located within the mandrel and coupled to the integrated circuit, wherein the PLC chip is configured to receive a signal indicative of the internal condition of the electrochemical battery cell from the integrated circuit and to transmit the indicative signal to the battery management unit;
    wherein the battery management unit is configured to control operation of the plurality of electrochemical battery cells.

8. The battery module of claim 7, comprising a monobloc housing configured to house the plurality of electrochemical battery cells and the battery management unit.

9. The battery module of claim 8, wherein the monobloc housing comprises a cover that hermetically seals the plurality of electrochemical battery cells and the battery management unit within the monobloc housing.

10. The battery module of claim 9, wherein the cover comprises a power line that is configured to electrically couple the plurality of electrochemical battery cells when the cover hermetically seals the plurality of electrochemical battery cells within the monobloc housing.

11. The battery module of claim 7, wherein the PLC chip in each electrochemical battery cell of the plurality of electrochemical battery cells is configured to modulate the respective indicative signal, and wherein the battery management unit is configured to demodulate the respective modulated indicative signals from the plurality of electrochemical battery cells.

12. The battery module of claim 7, comprising a wireless communication unit located within the battery module, and coupled to the PLC chip of each electrochemical battery cell of the plurality of electrochemical battery cells, wherein each wireless communication unit is configured to receive the indicative signal from the connected PLC chip and configured to wirelessly transmit the indicative signal to the battery management unit.

13. An electrochemical battery cell, comprising:
    an electrically insulating hollow mandrel;
    a pair of active materials wound on the mandrel, wherein the pair of active materials comprises an anode and a cathode;
    an integrated circuit located within the mandrel and directly coupled to the pair of active materials, wherein the integrated circuit comprises a processor, a memory, and a sensor having a graphene-based temperature sensor head, wherein the processor of the integrated circuit is configured to:
        receive a measurement of the temperature of the pair of active materials from the sensor;
        determine an internal condition of the electrochemical battery cell from the measured temperature; and
        generate a signal indicative of the internal condition; and
    a power line communications (PLC) chip located within the mandrel and coupled to the integrated circuit, wherein the PLC chip is configured to receive the indicative signal from the integrated circuit and transmit the indicative signal to a battery management unit external to the electrochemical battery cell.

14. The electrochemical battery cell of claim 13, wherein the electrochemical battery cell is configured to be electrically coupled to at least one other electrochemical battery cell by a power line.

15. The electrochemical battery cell of claim 14, wherein the PLC chip is configured to transmit the indicative signal to the battery management unit via the power line.

16. The electrochemical battery cell of claim 13, wherein the PLC chip is configured to modulate the indicative signal, and the battery management unit is configured to demodulate the indicative signal.

17. The electrochemical battery cell of claim 13, comprising a wireless communication unit coupled to the PLC chip, wherein the wireless communication unit is configured to receive the indicative signal from the PLC chip and configured to wirelessly transmit the indicative signal to the battery management unit and configured to wirelessly transmit the indicative signal to the battery management unit.

18. The electrochemical battery cell of claim 13, wherein the mandrel comprises a conductive coating that forms a pair of electrode leads that directly couple the pair of active materials to the integrated circuit.

* * * * *